(12) United States Patent
Harrer

(10) Patent No.: US 11,239,650 B2
(45) Date of Patent: Feb. 1, 2022

(54) DIGITAL INPUT CIRCUIT FOR RECEIVING DIGITAL INPUT SIGNALS FROM A SIGNAL GENERATOR

(71) Applicant: Pilz GmbH & Co. KG, Ostfildern (DE)

(72) Inventor: Bernd Harrer, Ostfildern (DE)

(73) Assignee: Pilz GmbH & Co. KG, Ostfildern (DE)

( * ) Notice: Subject to any disclaimer, the term of this patent is extended or adjusted under 35 U.S.C. 154(b) by 0 days.

(21) Appl. No.: 16/874,282

(22) Filed: May 14, 2020

(65) Prior Publication Data
US 2020/0381914 A1 Dec. 3, 2020

(30) Foreign Application Priority Data
May 29, 2019 (DE) ...................... 10 2019 114 460.4

(51) Int. Cl.
*H02H 3/20* (2006.01)
*H01H 1/00* (2006.01)
*H02H 1/00* (2006.01)

(52) U.S. Cl.
CPC ............ *H02H 3/20* (2013.01); *H02H 1/0007* (2013.01)

(58) Field of Classification Search
CPC ........ H02H 1/0007; H02H 3/20; H03K 17/30; H03K 17/795; H03K 17/7955; H03K 19/007; H03K 5/08
See application file for complete search history.

(56) References Cited

U.S. PATENT DOCUMENTS

| | | | | |
|---|---|---|---|---|
| 6,034,612 A * | 3/2000 | Heckel | ..................... | G05B 9/03 324/528 |
| 7,719,255 B2 * | 5/2010 | Oster | ............. | H03K 19/017572 324/76.11 |

(Continued)

FOREIGN PATENT DOCUMENTS

| DE | 19510332 A1 | 10/1996 |
|---|---|---|
| DE | 102011015498 A1 | 10/2012 |

(Continued)

OTHER PUBLICATIONS

Office Action in corresponding German Patent Application No. 102019114460.4, dated Jun. 29, 2020, with English translation.

(Continued)

*Primary Examiner* — Jared Fureman
*Assistant Examiner* — Nicolas Bellido
(74) *Attorney, Agent, or Firm* — Edell, Shapiro & Finnan, LLC

(57) ABSTRACT

A digital input circuit for receiving digital input signals of at least one signal generator comprises first and second subcircuits. Each subcircuit includes a digital input to receive a digital input signal and a threshold value element to determine a logic state of the subcircuit. Each subcircuit adopts a first state in response to its digital input signal reaching or falling below a lower threshold value and adopts a second state in response to its digital input signal reaching or exceeding an upper threshold value. The digital input circuit further comprises a combined test and current increasing apparatus to generate a driving signal such that a function test of both the first and second subcircuits is conducted simultaneously with the driving signal and an input current of the digital inputs is increased.

14 Claims, 4 Drawing Sheets

(56) References Cited

U.S. PATENT DOCUMENTS

| | | | | |
|---|---|---|---|---|
| 2002/0180278 A1* | 12/2002 | Veil | .......................... | G05B 9/02 |
| | | | | 307/326 |
| 2015/0357140 A1* | 12/2015 | Veil | ..................... | H01H 47/005 |
| | | | | 307/129 |
| 2016/0118212 A1* | 4/2016 | Veil | ....................... | H01H 71/10 |
| | | | | 307/326 |

FOREIGN PATENT DOCUMENTS

| | | | | | |
|---|---|---|---|---|---|
| DE | 102013101932 A1 | * | 8/2014 | ........... | H01H 47/004 |
| DE | 102013106739 A1 | * | 12/2014 | ........... | G05B 19/058 |
| DE | 102013106739 A1 | | 12/2014 | | |
| EP | 2506436 A2 | * | 10/2012 | ..... | H03K 19/017572 |
| WO | 0148570 A1 | | 7/2001 | | |

OTHER PUBLICATIONS

Search report in corresponding European Patent Application No. 20176448, dated Oct. 27, 2020, with English translation.

* cited by examiner

US 11,239,650 B2

DIGITAL INPUT CIRCUIT FOR RECEIVING DIGITAL INPUT SIGNALS FROM A SIGNAL GENERATOR

CROSS REFERENCE TO RELATED APPLICATIONS

This application claims foreign priority under 35 U.S.C. § 119(a)-(d) to Application No. DE 102019114460.4 filed on May 29, 2019, the entire contents of which are hereby incorporated by reference.

TECHNICAL FIELD

The present disclosure relates to a digital input circuit for receiving digital input signals of at least one signal generator, the digital input circuit comprising: a first sub circuit with a first digital input, via which a first digital input signal can be fed to the first subcircuit, and with a first threshold value element, by which a state of the first subcircuit can be determined, wherein the first subcircuit adopts a first state, when the first digital input signal reaches or drops below a lower threshold value, and wherein the first subcircuit adopts a second state, when the first digital input signal reaches or exceeds an upper threshold value; as well as at least one second subcircuit with a second digital input, via which a second digital input signal can be fed to the second subcircuit, and with a second threshold value element, by which a state of the second subcircuit can be determined, wherein the second subcircuit adopts a first state, when the second digital input signal reaches or drops below a lower threshold value, and wherein the second subcircuit adopts a second state, when the second digital input signal reaches or exceeds an upper threshold value.

BACKGROUND

A digital input circuit of the aforementioned type may be used, for example, in a switching apparatus or in a safety switching apparatus, where both switching apparatus and safety switching apparatus are intended for safety-related applications, in particular, in automatically operating technical systems. Such a digital input circuit comprises at least two digital inputs, via which digital input signals of at least one signal generator can be received. These digital input signals come, for example, from sensor units or event signaling devices, such as, for example, emergency OFF push buttons, emergency STOP push buttons, safety doors or safety shutdown mats, which may be signal generators for the purpose of the present description.

Digital input signals, which are received by the digital input circuit, are binary signals and are characterized by two defined states, which can be defined, for example, by two static potentials. These binary states are characterized by different voltage states, wherein a first state is adopted when a defined voltage threshold value is reached or undershot. In this case it is a so-called low level state. A second state is adopted when a defined voltage threshold value is reached or exceeded. In this case it is a so-called high level state.

Digital input circuits for receiving digital input signals of at least one signal generator are known from the prior art in a wide range of embodiments. In the case of current drawing digital input circuits, which are typically operated with an operating voltage of 24 V (DC), a distinction is made between three different types (type 1, type 2 and type 3) in conformity with the EN 61131-2:2007 standard. These three types of digital input circuits differ, in particular, in their high levels, their low levels and in their current consumption.

Type 1 digital input circuits must necessarily detect a high level by the time the input voltage reaches 15 V. Therefore, in practice this high level is already detected at an input voltage of <15 V. Furthermore, the type 1 digital input circuits have to detect a high level over an entire input voltage range of from 15 V to 30 V. The current consumption in the high level range is ≥2 mA and can be up to 15 mA. Furthermore, the type 1 digital input circuits (as well as the types 2 and 3 mentioned further below) have to be capable of detecting a low level over an entire range of from −3 V to 5 V. Therefore, in practice a low level is already detected at input voltages of >5 V. In the range of from −3 V to 5 V the input current may be between 0 mA and 15 mA. A current limit of 0.5 mA is relevant when the input voltage is between 5 V and 15 V. In this range the input must also detect a low level, in so far as the input current is ≤0.5 mA. Such type 1 digital input circuits are used, in particular, for electromechanical switching apparatuses, such as, for example, push buttons or relay contacts, or else for three conductor sensor units. Emergency OFF switching apparatuses are a typical example of an application for type 1 digital input circuits.

Type 2 digital input circuits are suitable, for example, for two conductor sensor units and for semiconductor sensors that require a relatively high quiescent current to operate them. The current consumption in the high level range, which is between 11 V and 30 V, is typically 6 mA and can be up to 30 mA.

Type 3 digital input circuits are characterized, in particular, in the case of high electrical voltages, by a lower power consumption and less heat dissipation, as compared to the type 2 digital input circuits, so that a larger number of digital input circuits and, thus, a larger number of physical digital inputs can be combined to form a digital input module than is the case with type 2 digital input circuits. Type 3 digital input circuits have to detect a high level in the input voltage range between 11 V and 30 V. The current consumption is typically ≥2 mA in the high level range, which is between 11 V and 30 V, and can be up to 15 mA. In the input voltage range between −3 V and 5 V the type 3 digital input circuits have to detect a low level at an allowable current consumption between 0 mA and 15 mA. In addition, a low level has to be detected when the input voltage is between 5 V and 11 V; and the input current is ≤1.5 mA.

Digital input circuits with digital inputs are used in numerous safety-related applications, where in this case the input circuits comprise at least one test apparatus, with which it is checked periodically as to whether the subcircuits, associated with the digital inputs, are still capable of detecting input signals of low levels, which correspond to a safe state. Such a digital input circuit is known, for example, from the document DE 10 2013 106 739 A1.

In principle, it would be desirable if a digital input circuit, which comprises a test apparatus of the aforementioned type, could also be equipped with a current increasing apparatus in order to increase the input current for a short term at the digital inputs without thereby reducing the level of safety. This problem of reducing the level of safety surfaces, in particular, whenever the objective is to implement a plurality of reliable digital inputs in one module in a cost effective manner.

The advantages of a short-term increase of the input current, such as, for example, a reduction in the interferences, in particular, in the case of open lines at the digital inputs, are described in detail in the document DE 10 2013 101 932 A1. From the aforementioned document it is known to actively counteract potential interferences at the input by cyclically increasing the input current. Therefore, the increase in current does not take place continuously, but rather only at defined instants of time. A corresponding current increasing apparatus ensures in its activated state a reliable and fast evaluation of the digital inputs. The current increasing apparatus is activated preferably when faults, such as those caused, for example, by cross talk, are to be taken into account in the evaluation of the digital inputs. Owing to the increased flow of current at the digital inputs, a binary state in the form of a defined voltage level at the digital inputs can be produced much more quickly. In particular, the digital OFF state, in which the zero potential (i.e., a low level signal) is usually expected, can be detected more quickly and, above all, more reliably.

SUMMARY

One possible solution to the problem of implementing a digital input circuit with at least two reliable digital inputs in one module, which comprises not only a test function, but also a current increasing function, could be produced by a combination of a test apparatus, as described in the document DE 10 2013 106 739 A1, with a current increasing apparatus, as disclosed in the document DE 10 2013 101 932 A1. However, this combination is associated with a considerable amount of disadvantages, which will be explained as follows.

FIG. 1 shows such a digital input circuit 200 with two digital inputs I1, I2, a test apparatus 201 and a current increasing apparatus 202. Some important aspects of this digital input circuit 200 shall be explained below, but without going into depth on all of the details of the circuit design.

In order to implement the digital input circuit 200, shown in FIG. 1, the example embodiment, shown in FIG. 3 of the document DE 10 2013 106 739 A1, is used for the test apparatus 201; and the example embodiment, shown in FIG. 7 of the document DE 10 2013 101 932 A1, is used for the current increasing apparatus 202. The major disadvantage of this implementation consists of the fact that just a single component fault, i.e., a short circuit of a decoupling diode 203, 204 in the current increasing path of one of the two digital inputs I1, I2, could lead to a hazardous state. A short circuit of the decoupling diode 203 of the second input I2 by a bridge F1, which is marked on the drawing, has been illustrated in schematic form in FIG. 1. In this case there would be a hazardous state, if a high level signal were being applied to the first input I1, and a (high resistance) low level signal (for example, by an activated emergency OFF switch) were being applied at the second input I2. In this case the high level signal at the first input I1 would lead to a current flow over the current increasing path of the first input I1 and the short circuit F1 into the subcircuit of the second digital input I2. The consequence would be that the low level signal, which is actually available at the second digital input I2, would be "overwritten" by the high level signal at the first digital input I1. Thus, the subcircuit, associated with the second digital input I2, could now also detect a high level state. The result would be an immediate hazardous situation that could not be detected by the test apparatus 201, even during the test of the subcircuits of the two digital inputs I1, I2, because during the test both subcircuits of the inputs I1, I2 would continue to detect a low level state, which would be expected in a faultless state of the subcircuits of the two digital inputs, irrespective of the existing component fault of the decoupling diode 203. Therefore, the component fault and, thus, the hazardous situation remain undetected.

If the digital inputs I1 and I2 of the digital input circuit 200 are used to detect a dual channel sensor signal, then the non-detectable short circuit F1 of the decoupling diode 203 of the second input I2 will cause the dual channel structure of the subcircuits of the two digital inputs I1, I2 to be cancelled. The result of this feature is that an additionally occurring, so-called "stuck at high fault" (i.e., holding steady in the high level state) at the first digital input I1 is sufficient to "overwrite" a low level signal of the signal generator at the second digital input I2 with the faulty high level signal at the first digital input I1. That means that even in the case of a dual channel mode just two faults are sufficient to lead to a hazardous state.

FIG. 2 shows a digital input circuit 300 comprising a test apparatus 301, as shown in accordance with FIG. 3 of the document DE 10 2013 106 739 A1, where a decoupling diode 303, 304, respectively, as shown in accordance with FIG. 7 of the document DE 10 2013 101 932 A1, was inserted into each of the current increasing paths of the digital inputs I1, I2. The digital input circuits 200, 300, shown in FIGS. 1 and 2, have various interface connections or, more specifically, connection points of the current increasing apparatuses 202, 302 at the respective input circuits 200, 300. On closer examination, it is clear that even this embodiment is associated with a considerable number of practical disadvantages.

In order for a hazardous state to be able to occur in this variant, there would have to be, depending on the size, three or four component faults. Such component faults would be, for example, an interruption of the base of a transistor T1 of the subcircuit of the first digital input I1 (fault F1), a short circuit of the decoupling diode 303 of the subcircuit of the second digital input I2 (fault F2), an interruption of the collector of an optocoupler 305 of the current increasing apparatus 302 (fault F3) and, depending on the size, also a short circuit of a resistor 306 between the collector and the base of the transistor T1 of the subcircuit of the first digital input I1 (fault F4). In the event of these faults a high level signal at the first digital input I1 would in turn lead to a flow of current through the two current increasing apparatuses and the optocoupler of the subcircuit of the second digital input I2. Then in the event of a fault a low level signal at one input (in the present embodiment at the second digital input I2) could in turn be "overwritten" by a high level signal at another input (in the present embodiment at the first digital input I1). In this case, too, there would still be the disadvantage that none of the faults F1 to F4 could be detected by the test of the subcircuits of the two digital inputs I1, I2. Therefore, an accumulation of faults could cause a hazardous situation to occur even in the case of the digital input circuit 300, shown in FIG. 2, both in the single channel mode and also in the dual channel mode.

Based on the aforesaid, an object is to provide a digital input circuit of the aforementioned type that makes it possible to increase the current at the digital inputs, that reaches a high safety level in the event of faults, in particular, in the event of component faults of the circuit architecture and that at the same time is simple in design.

A digital input circuit as disclosed comprises a combined test and current increasing apparatus that is designed to generate a driving signal such that a function test of both subcircuits is conducted simultaneously with this driving signal, and an input current of the digital inputs is increased. The inventive digital input circuit comprising the combined test and current increasing apparatus makes it possible in an advantageous way to increase, in particular, cyclically the input current at the digital inputs and at the same time to conduct a function test of the subcircuits of the digital inputs. Owing to the inventive combination of a test apparatus with a current increasing apparatus to form a single test and current increasing apparatus, the safety level of the digital input circuit stays at a very high level in an advantageous way even in the presence of potentially hazardous (component) faults. Potentially hazardous (component) faults are detected reliably by the test that is conducted at the same time during the current increasing phases. Furthermore, it is possible to dispense with a galvanically isolating, similarly potentially faulty component in an advantageous way. This aspect helps to simplify the circuit design and to reduce potential fault sources. An essential characteristic of the disclosed digital input circuit with the correspondingly designed test and current increasing apparatus consists of the feature that in the event of the occurrence of a fault current that is so high that one of the two subcircuits detects a high level state, even though a low level signal is being applied to its input, this fault current continues to flow even during active testing and active current increase. As a result, at least the potentially hazardous component faults are detected by the test. In particular, the disclosed circuit allows even type 3 digital input circuits to be implemented in compliance with the requirements of the IEC 61131-2 standard.

In a preferred embodiment it is proposed that the digital input circuit is designed such that the subcircuits of the digital inputs have just a single cross connection to each other. As a result, the risk that one of more (component) fault(s) in one of the at least two subcircuits can affect the respective other subcircuit can be further reduced in an advantageous way. This design is made possible, in particular, by the fact that the disclosed digital input circuit comprises the combined test and current increasing apparatus and not at least one test apparatus and one current increasing apparatus that is separate from the test apparatus.

In a particularly preferred embodiment it is proposed that the subcircuits are designed such that when the driving signal of the combined test and current increasing apparatus is received for the test of the subcircuits, the levels of the digital input signals, which are fed via the digital inputs to the subcircuits, are lowered internally until they correspond to the first state of the subcircuit concerned. In other words, in response to receiving a driving signal for testing, the subcircuits are configured to internally lower levels of the respective digital input signals to correspond to the first state. Thus, during the test a low level state, which corresponds to the first state of the relevant subcircuit, has to be detected by the subcircuits, which are associated with the two inputs, even if a high level signal, which represents the second state, is being applied to the respective digital inputs. If this first state (low level state) is not detected by at least one of the subcircuits, then there is a fault.

In one advantageous embodiment it is proposed that the first subcircuit is a first electronic switching element, in particular, a first switching transistor, by which the combined test and current increasing apparatus is connected to the first subcircuit.

In another advantageous embodiment it is provided that the second subcircuit is a second electronic switching element, in particular, a second switching transistor, by which the combined test and current increasing apparatus is connected to the second subcircuit.

The electronic switching elements, which are designed preferably as switching transistors, can be driven by the driving signal of the combined test and current increasing apparatus. In a preferred embodiment the electronic switching elements, in particular, the switching transistors, of the first and second subcircuit can be connected in parallel to each other.

In a particularly advantageous embodiment it is proposed that each of the two subcircuits comprises at least two voltage stabilizing elements and two current sources, wherein these current sources are connected preferably crosswise one behind the other such that at least for input signals, which define the second state of the subcircuits, an electric current, which flows through the voltage stabilizing element of the first current source, consists essentially of a stabilized current of the second current source; and the electric current, which flows through the voltage stabilizing element of the second current source, consists essentially of a stabilized current of the first current source. In this way, it is achieved that two parallel constant or rather substantially constant currents flow in the area of the first and second current source of each of the two subcircuits.

In a particularly advantageous embodiment, it may be provided that the combined test and current increasing apparatus comprises a clock reference apparatus that is designed to modulate the driving signal of the current increasing apparatus. Thus, the clock reference apparatus is used to generate a modulated (clocked) driving signal, which makes it possible to increase the current at the two digital inputs and by which the functionality of the at least two subcircuits can be tested at the same time. The clock reference apparatus can be synchronized, for example, to a clock of an interfering signal occurring cyclically at the digital inputs.

According to another aspect, a safety switching apparatus for switching on and fail-safe switching off a consumer is disclosed, in particular, a technical system, where in this case the safety switching apparatus comprises a digital input circuit with at least two digital inputs for receiving digital input signals of at least one signal generator.

BRIEF DESCRIPTION OF THE DRAWINGS

Other features and advantages of the disclosed circuit will become apparent from the following description of example embodiments with reference to the accompanying drawings.

DETAILED DESCRIPTION

Figure 1:
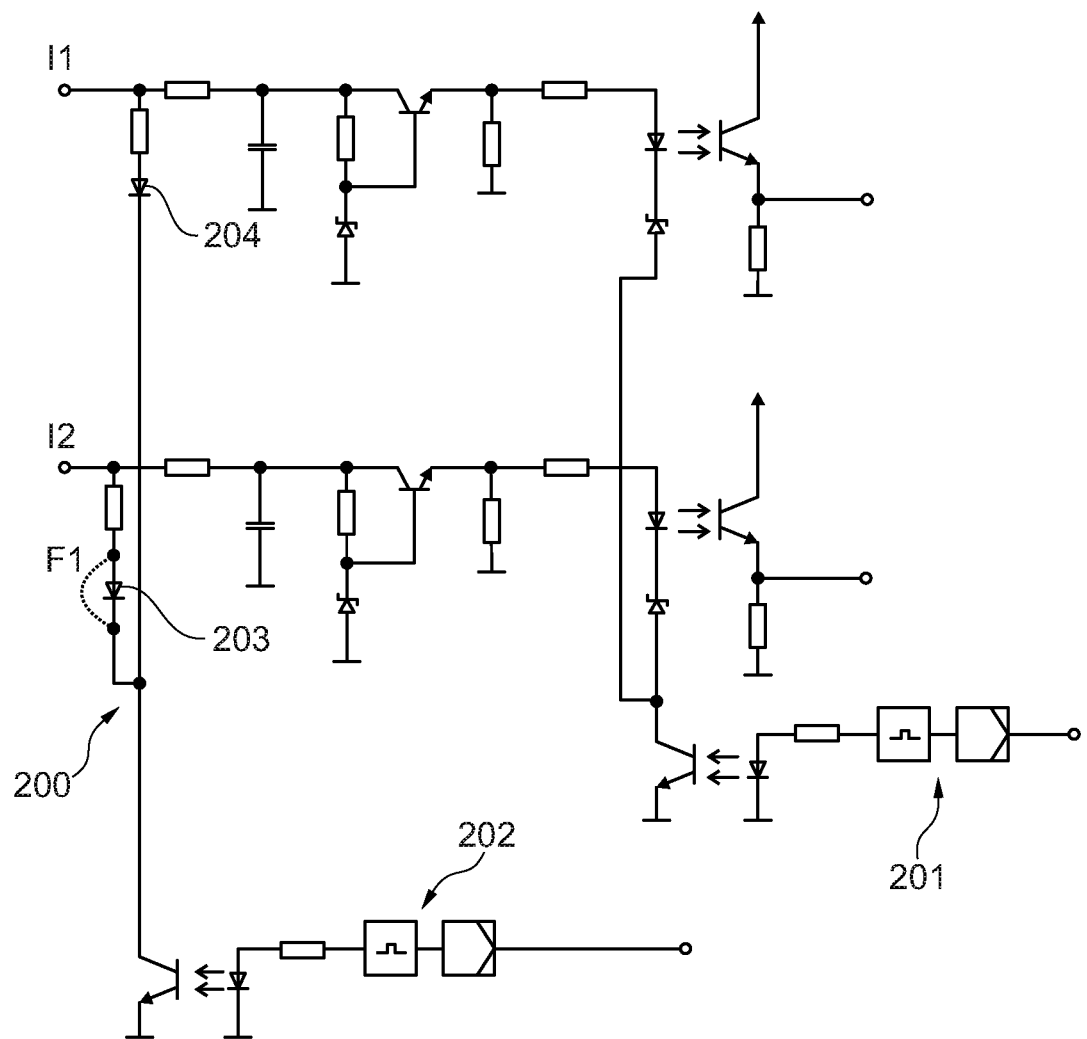
FIG. 1 is an example of a digital input circuit that is not the subject matter of the present invention.
Figure 2:
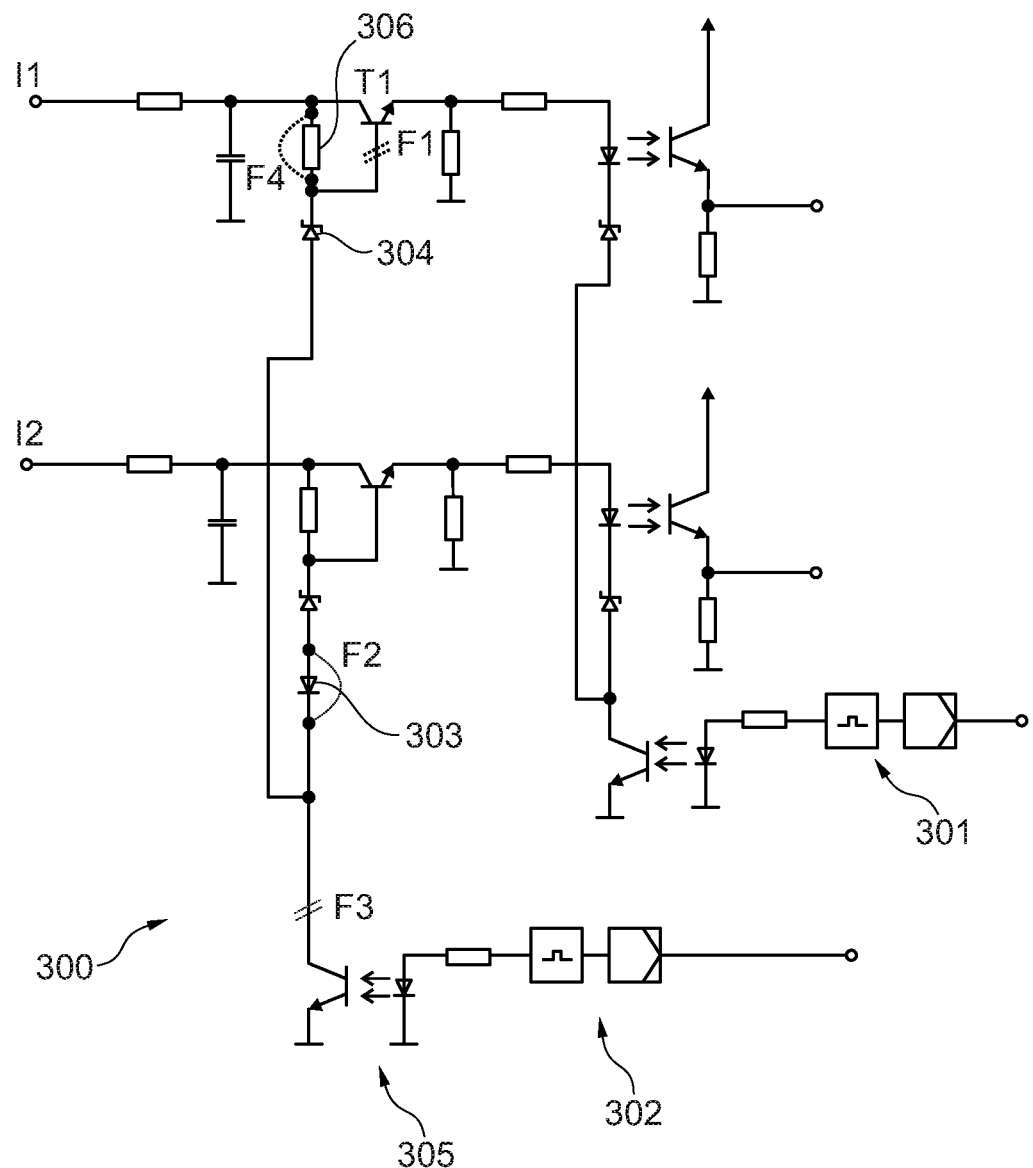
FIG. 2 is another example of a digital input circuit that is not the subject matter of the present invention.

A preferred example embodiment of a digital input circuit 100 shall be explained in greater detail below with reference to FIG. 3.

The digital input circuit 100 has a first circuit section I, which forms a primary side of the digital input circuit 100 and comprises a first digital input 10 and a second digital input 10', via which digital inputs the binary input signals of at least one signal generator, which is not explicitly depicted here, can be fed to the digital input circuit 100. The at least one single generator, which can make a digital input signal available to the digital input circuit 100, can be, in particular, a sensor unit or an event signaling device, such as, for example, an emergency OFF push button, an emergency STOP push button, a safety door, a safety shutdown mat, a two-hand switch, an end position switch or a position switch. The event signaling device can also operate, for example, without mechanical contact and can be designed, for example, as a light curtain or a light barrier or alternatively may comprise them.

The digital input signals, which are provided by the at least one signal generator, are binary signals and are characterized by two defined states that may be given, in particular, by two static potentials. As already explained above, these two states are characterized by various voltage levels. In this case the states are a first state, in which the input voltage $U_{IN}$ drops below a defined threshold value and which is often also referred to as the low level state, as well as a second state, in which the input voltage $U_{IN}$ exceeds a defined threshold value and which is often also referred to as the high level state. The low level state is characterized by an input voltage $U_{IN} \leq U_{Low,\ max}$ as well as by an input current $I_{IN} \leq I_{Low,\ max}$. The high level state is defined by an input voltage $U_{High,\ min} \leq U_{IN} \leq U_{High,\ max}$ and by an input current $I_{IN} \geq I_{High,\ min}$.

Furthermore, the digital input circuit 100 has a second circuit section II, which forms a secondary side of the digital input circuit 100. Three coupling elements 11, 11', 21, which will be discussed in even greater detail further below, cause a complete galvanic isolation 13 of the two circuit sections I, II. This galvanic isolation 13 makes it possible, in particular, to protect the electronic components, provided in the second circuit section II, from being destroyed by power surges and the resulting faults upon detection of the OFF state.

The digital input circuit 100 comprises a subcircuit section 14, 14' for each of the two digital inputs 10, 10'. A first subcircuit 14 is fed the digital input signal of the first input 10; and a second subcircuit 14' is fed the digital input signal of the second input 10'. In the example embodiment shown here, both subcircuits 14, 14' have an identical circuit design, which shall be explained in greater detail below. The subcircuits 14, 14' are divided into the first circuit section I and the second circuit section II.

The two subcircuits 14, 14' comprise in each case an input resistor 17, 17' as well as at least one input filter 12, 12', which is provided to improve the electromagnetic compatibility (in short: EMC). Generally the input filters 12, 12' can comprise one or more components to improve the electromagnetic compatibility. These components may be, in particular, capacitors, resistors and diodes (for example, Zener diodes) to smooth the input signals or, more specifically, to limit a defined input voltage. In the present case the input filters 12, 12' of the two subcircuits 14, 14' are symbolized by a capacitor.

Connected to the input filters 12, 12' of the two subcircuits 14, 14' is in each case a current limiting apparatus 15, 15', which is designed as a linear regulator in this example embodiment, and which comprises a transistor 150, 150' that is designed as a bipolar transistor (NPN transistor), a Zener diode 151, 151' as well as a series resistor 152, 152' for the Zener diode 151, 151'. The current limiting apparatuses 15, 15' determine a maximum current flow into the digital inputs 10, 10' that are associated with the current limiting apparatuses.

Finally the current limiting apparatus 15 of the first digital input 10 is followed by a first coupling element 11 and a first threshold value element 16. In this example embodiment the first coupling element 11 is an optocoupler with a light emitting diode 110 on the primary side in the first circuit section I and with a collector-emitter path 111 on the secondary side in the second circuit section II. As a result, there is a galvanic isolation 13 in this part of the circuit. The input signal, which is fed in via the first digital input 10, is transferred to the second circuit section II by the first coupling element 11, wherein the first threshold value element 16 is used to set a defined threshold value that has to be exceeded by the digital input signal, which is fed in via the first digital input 10, so that the input signal can be transferred to the second circuit section II with the aid of the first coupling element 11. Hence, the first coupling element 11 and the first threshold value element 16 are capable of detecting the respective state of the input signal (high level state or low level state) at the first digital input 10. Consequently they are largely responsible for the detection of the low level state (OFF state).

In this example embodiment the first threshold value element 16 is a Zener diode that is arranged directly at the cathode of the light emitting diode 110 of the optocoupler, so that at that location a defined voltage level is set as the threshold value. Not until the input signal at the first digital input 10 exceeds this voltage level does a current flow through the light emitting diode 110 of the optocoupler, so that the collector-emitter path 111 of the optocoupler becomes electrically conductive. In this way a high level signal at the first digital input 10 can be detected.

In an analogous manner the current limiting apparatus 15' of the second digital input 10' is followed by a second coupling element 11' as well as a second threshold value element 16'. In this example embodiment the second coupling element 11' is also an optocoupler with a light emitting diode 110' on the primary side in the first circuit section I and with a collector-emitter path 111' on the secondary side in the second circuit section II. As a result, there is also a galvanic isolation 13 in this part of the circuit. The input signal, which is fed in via the second digital input 10', is transferred to the second circuit section II by the second coupling element 11', wherein the second threshold value element 16' is also used to set a defined threshold value that has to be exceeded by the input signal, which is fed in via the second digital input 10', so that the input signal can be transferred to the second circuit section II with the aid of the second coupling element 11'. Hence, the second coupling element 11' and the second threshold value element 16' detect in turn the respective state of the input signal at the second digital input 10' and are consequently largely responsible for the detection of the low level state (OFF state).

In this example embodiment the second threshold value element 16' is also a Zener diode that is arranged directly at the cathode of the light emitting diode 110' of the optocoupler, so that at that location a defined voltage level is set as the threshold value. Not until the input signal at the second digital input 10' exceeds this voltage level does a current flow through the light emitting diode 110' of the optocoupler, so that the collector-emitter path 111' of the optocoupler becomes conductive.

The digital input signals travel via two outputs 18, 18', each of which is connected to one of the two collector-emitter paths 111, 111', to at least one downstream logic unit, which is not explicitly shown here, for further signal processing. A dedicated logic unit is provided preferably for each of the two outputs 18, 18'. The logic units may consist, for example, of integrated semiconductor components, in particular, microcontrollers, ASICs, FPGAs or other integrated logic components and may be designed preferably with two channels in order to ensure a reliable signal processing. The logic units may be part of the digital input circuit 100 or part of a switching apparatus, in particular, a safety switching apparatus, by which a consumer that is connected to such an apparatus, can be switched on and safely switched off. In this case the logic units generate, as a function of the input signals, one or more output signals for driving a consumer, in particular, a technical system. As an alternative, it is also possible to provide just a single logic unit for both outputs 18, 18'. Furthermore, the digital input circuit 100 comprises a combined test and current increasing apparatus 20, which is implemented partially in the first circuit section I and partially in the second circuit section II in the example embodiment that is shown here. The combined test and current increasing apparatus 20 comprises the third coupling element 21, which causes a coupling with the first circuit section I and, thus, with the primary side of the digital input circuit 100. In this example embodiment the third coupling element 21 is an optocoupler with a light emitting diode 210 in the second circuit section II and with a collector-emitter path 211 in the first circuit section I. As a result, there is a galvanic isolation 13 in this part of the circuit.

The collector-emitter path 211 of the third coupling element 21 has a connection 212, by which the third coupling element 21, which is part of the combined test and current increasing apparatus 20, is connected to a first electronic switching element of the subcircuit 14 of the first digital input 10, where in the present embodiment the first electronic switching element is designed as a first switching transistor 23. In addition, the third coupling element 21 is also connected by the connection 212 to a second electronic switching element of the subcircuit 14' of the second digital input 10', where in the present embodiment the second electronic switching element is designed as a second switching transistor 23'. In this case the switching transistors 23, 23' of the two subcircuits 14, 14', where in the present embodiment the switching transistors are designed as bipolar transistors (NPN transistors), are connected in parallel to each other and are connected to each other only by a single cross connection 213, which also forms the single cross connection between the two subcircuits 14, 14'. The connection to the connection 212 of the third coupling element 21 takes place by a common feed line 214. The base of each of the two switching transistors 23, 23' is connected in each case to a series resistor 19, 19'.

The combined test and current increasing apparatus 20 is designed to generate a driving signal, where in this case the same driving signal makes it possible to test the subcircuits 14, 14', associated with the two digital inputs 10, 10' at the same time; and, in addition, the input current at the digital inputs 10, 10' can also be increased.

The combined test and current increasing apparatus 20 comprises a clock reference apparatus 24 that is connected to the third coupling element 21, so that the third coupling element 21 is closed and opened again in synchronization with the clock reference apparatus 24 and, as a result, is or is not electrically conductive. Therefore, the clock reference apparatus 24 is used to generate a clocked, modulated driving signal that makes it possible to increase the current at the two digital inputs 10, 10' and by which the functionality of the two subcircuits 14, 14' can be tested at the same time. The driving signal drives in each case the base of the switching transistors 23, 23'.

For the test the levels of the digital input signals, which are fed in via the digital inputs 10, 10', are lowered internally until a low level state has to be detected by the subcircuits 14, 14', which are associated with the two digital inputs 10, 10', even if a high level signal is being applied to the digital inputs 10, 10' concerned. In other words, in response to receiving the driving signal, the subcircuits 14, 14' are configured to internally lower levels of the respective digital input signals 10, 10' to correspond to the low level state.

When the combined test and current increasing apparatus 20 is activated and cyclically generates the driving signal, the emitter potentials of the transistors 150, 150' of the current limiting apparatuses 15, 15' are pulled down to a level close to 0 V (i.e., a low level signal that corresponds to the first state) by the switching transistors 23, 23', which are driven by the driving signal of the combined test and current increasing apparatus 20. In this way it is achieved that the optocoupler, which forms the first coupling element 11, and the optocoupler, which forms the second coupling element 11', are blocked; and consequently the subcircuits 14, 14' of the two digital inputs 10, 10' have to detect low level states, in so far as they operate flawlessly. At the same time an increased input current flows through the transistors 150, 150' of the current limiting apparatuses 15, 15' of the two subcircuits 14, 14'. The increased input current is limited in essence only by the magnitude of the input resistor 17, 17' for the respective inputs 10, 10'. If now in the activated state of the combined test and current increasing apparatus 20, in which the driving signal is generated in the manner explained above, no low level state is detected by one or both subcircuits 14, 14', then there is a fault.

The clock reference apparatus 24 can be synchronized, for example, to a clock of an interfering signal that occurs cyclically at the digital inputs 10, 10'. The increase in current (and consequently also the test of the two subcircuits 14, 14') can be deactivated again, when the interference effect has subsided. In this case the deactivation can take place after a defined switching period of the third coupling element 21, where the switching period is adjusted here by a regulating element 25, which is connected to the clock reference apparatus 24, or actively when a higher level control/evaluation unit of a control system, in particular, a safety control system, or a logic unit, which may be part of the digital input circuit 100 or part of a control system, has detected a defined state. The regulating element 25 for adjusting the switching period can also be integrated, for example, in the higher level control/evaluation unit or in a logic unit.

In particular, electrical cross connections between the two digital inputs pose a potential safety-related risk of the two digital inputs 10, 10'. If two separate test and current increasing apparatuses for two (or even more) digital inputs 10, 10' are used, then the result is also at least two separate cross connections between the digital inputs 10, 10'. As already explained in detail above, this situation can result in the inability to detect anymore those component faults, which may occur, as such in a reliable way and under some circumstances may result in hazardous states. Due to the combined test and current increasing apparatus 20, which is provided here and which combines both functions in a single module, there is just a single cross connection 213 between the subcircuits 14, 14' of the two digital inputs 10, 10'. In this case, the single cross connection constitutes those electrical connecting sections that connect the first switching transistor 23 and the second switching transistor 23' to each other. This single cross connection 213 makes it possible for potentially hazardous component faults of the digital input circuit 100 to be detected, in particular, at an early stage in an advantageous way, an aspect that will be explained in even greater detail below.

A safety-related risk generally starts from high level signals at the digital inputs 10, 10' and a voltage source at the third coupling element 21, which is designed as an optocoupler in the present embodiment. Therefore, when component faults occur, this situation could lead under some circumstances to a fault current over the existing cross connection 213 between the two digital inputs 10, 10', so that this fault current results in one of the digital inputs 10, 10' detecting a high level state, even though it is actually a low level signal that is being applied there.

The effects of various faults, which have been clearly marked with the reference symbols F1, F2, F3, F4, F5, F6 in FIG. 3, on the digital input circuit 100 shall be explained in detail below. In this case it shall be assumed that at the time viewed, a high level signal is being applied to the first digital input 10; and a low level signal is being applied to the second digital input 10'.

In this respect the faults F2 and F4 represent faulty, in particular, severed, ground connections of the first switching transistor 23 and the second switching transistor 23'. The other faults F1, F3, F5 and F6 are short circuits in the relevant electronic components of the first and second subcircuits 14, 14', respectively, where the such faults are symbolized by corresponding bridges.

Faults F1 and F2:

If the combined test and current increasing apparatus 20 is not activated and, as a result, no driving signal for increasing the current and for testing the subcircuits 14, 14' has been generated, then a fault current flows from the first digital input 10 through the transistor 150 of the current limiting apparatus 15 and the first switching transistor 23 of the first subcircuit 14 to the switching transistor 23' of the second subcircuit 14'. In this way, the second switching transistor 23' is switched on; and the emitter of the transistor 150' of the current limiting apparatus 15' of the second subcircuit 14' is pulled to a voltage value of 0 V, so that the safe low level state, which can be detected accordingly by the second subcircuit 14', is still present at the second digital input 10'.

If the combined test and current increasing apparatus 20 is activated and, as a result, a driving signal for increasing the current and for testing the sub circuits 14, 14' has been generated, then the optocoupler, which forms the first coupling element 11 of the first subcircuit 14, is conductive or blocks, as a function of the magnitude of the input voltage at the first digital input 10. Therefore, the fault detection during the test depends on the magnitude of the input voltage at the first digital input 10. However, the "reliable" detection of the faults F1, F2 is not yet necessary here, because there is no hazardous state, because the second digital input 10' stays in a safe state, since despite the F1, F2 faults there is still a (safe) low level state, which can be detected accordingly by the second subcircuit 14', at the second digital input.

Faults F1, F2, F4 and F5:

If the combined test and current increasing apparatus 20 is not activated, then a fault current flows from the first digital input 10 through the transistor 150 of the current limiting apparatus 15, the first switching transistor 23 of the first subcircuit 14, and over the base-collector path of the second switching transistor 23', which is provided in the second subcircuit 14', into the optocoupler of the second subcircuit 14', where the optocoupler forms the second coupling element 11'. In this case, the fault current may be sufficient, so that the second subcircuit 14', which is associated with the second digital input 10', detects the potentially hazardous high level state.

If the combined test and current increasing apparatus 20 is activated, then the fault current is sufficient, so that the second subcircuit 14', which is associated with the second digital input 10', detects the potentially hazardous high level state. As a result, these faults are detected during the test.

Faults F2, F4, F5 and F6:

If the combined test and current increasing apparatus 20 is not activated, then a fault current flows from the current source of the combined test and current increasing apparatus 20 at the optocoupler, which forms the third coupling element 21, over the base-collector path of the second switching transistor 23' into the optocoupler of the second subcircuit 14', where the optocoupler forms the second coupling element 11'. As a result, the subcircuit 14' of the second digital input 10' detects the potentially hazardous high state.

If the combined test and current increasing apparatus 20 is activated, then this fault current flows even during active testing. In this case the subcircuit 14' of the second digital input 10' detects in turn the potentially hazardous high level state. As a result, these faults are detected reliably during the test. At this point it should be noted that the faults F2 and F4 may also occur at the same time as so-called common cause faults.

An essential characteristic of the combined test and current increasing apparatus 20 of the present invention consists of the feature that in the event of the occurrence of a fault current that is so high that one of the two subcircuits 14, 14' detects a high level state, even though a low level signal is being applied to its input 10, 10', then this fault current continues to flow even during active testing and active current increase. As a result, at least the potentially hazardous component faults are detected by the test. Then the faulty digital inputs 10, 10' or an entire input module, which comprises these (and optionally even other) digital inputs 10, 10', can be set to a safe state and, for example, safely switched off.

The influence of the combined test and current increasing apparatus 20 on the reaction time of the digital inputs 10, 10' shall also be explained just briefly as follows. Since in this implementation the subcircuits 14, 14' of the digital inputs 10, 10' detect a low state during the phases of the current increase, the reaction time of the digital inputs 10, 10' increases by the duration of the current increase phase. Since, however, the current increase phases and, associated therewith, also the test phases can be kept relatively short (for example, about 200 μs) by the clock reference apparatus 24, this problem presents only an insignificant disadvantage.

The significant advantages of the digital input circuit 100 with the combined test and current increasing apparatus 20, as described here, over separate test and current increasing apparatuses are, in particular, maintaining a high safety level of the digital inputs 10, 10' in a wide range of circuit architectures, in particular, also in digital input circuits 100 with current sources, reliable detection of potentially hazardous (component) faults during the test, and dispensing with a galvanically isolating component.

Figure 3:
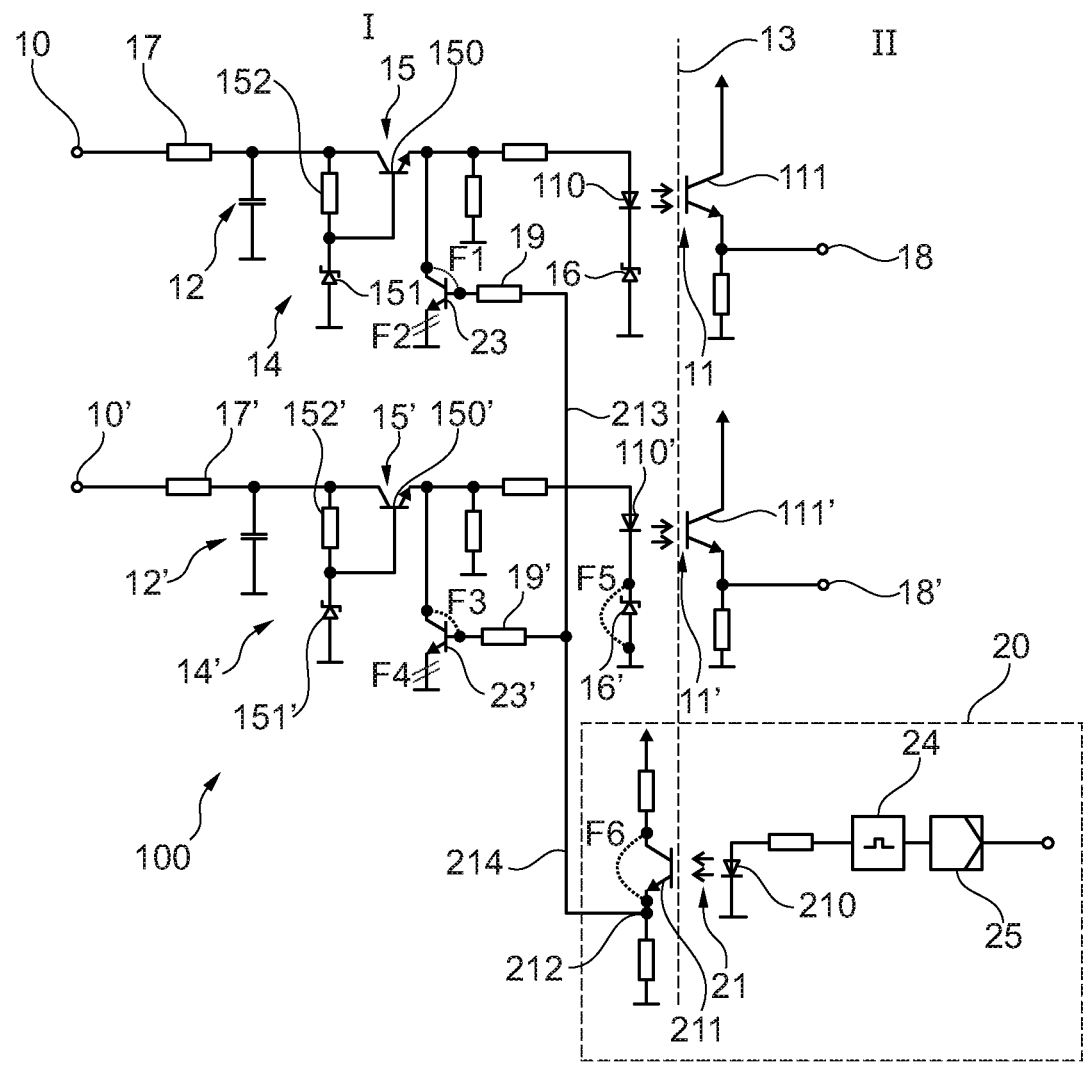
FIG. 3 is a digital input circuit that is designed in accordance with a preferred example embodiment of the present invention.

At this point it should also be noted that additional test apparatuses at the outputs of the galvanically isolating components, which in the present embodiment are the first and second coupling elements 11, 11' that are designed as optocouplers, between the circuit sections I and II, as described, for example, in the document DE 10 2013 106 739 A1, are not shown in FIG. 3. However, in order to implement reliable inputs 10, 10', these test apparatuses are still necessary, nevertheless.

Figure 4:
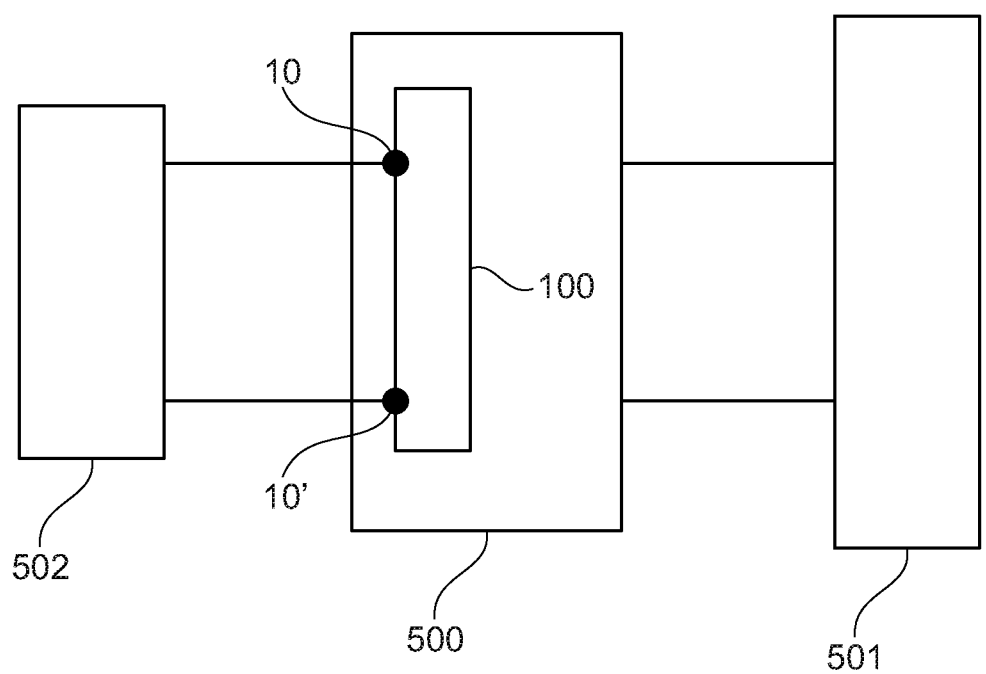
FIG. 4 is in schematic form a highly simplified representation of a safety switching apparatus with a digital input circuit that is designed in accordance with FIG. 3.

FIG. 4 shows in schematic form a highly simplified representation of a safety switching apparatus 500 for switching on and fail-safe switching off a consumer 501, in particular, a technical system. The safety switching apparatus 500 comprises a digital input circuit 100 with at least two digital inputs 10, 10' for receiving digital input signals of a signal generator 502, which may be, in particular, an event signaling device, such as, for example, an emergency OFF switch. The digital input circuit 100 is designed in the manner described above. The signal generator 502 is designed with two channels for reasons of redundancy. The connection between the safety switching apparatus 500 and the consumer 501 is also designed with two channels for redundancy reasons, so that there are two ways to switch off in order to shut off the consumer 501 in a safe way.

What is claimed is:

1. A digital input circuit for receiving digital input signals of at least one signal generator, the digital input circuit comprising:
   a first subcircuit including: a first digital input to receive a first digital input signal; and a first threshold value element to determine a logic state of the first subcircuit, wherein the first subcircuit adopts a first state in response to the first digital input signal reaching or falling below a first lower threshold value and adopts a second state in response to the first digital input signal reaching or exceeding a first upper threshold value;
   a second subcircuit including: a second digital input to receive a second digital input signal; and a second threshold value element to determine a logic state of the second subcircuit, wherein the second subcircuit adopts the first state in response to the second digital input signal reaching or falling below a second lower threshold value and adopts the second state in response to the second digital input signal reaching or exceeding a second upper threshold value; and
   a combined test and current increasing apparatus to generate a driving signal such that a function test of both the first and second subcircuits is conducted simultaneously with the driving signal, and an input current of the first and second digital inputs is increased, wherein, in response to receiving the driving signal for testing, the first and second subcircuits are configured to internally lower levels of the first and second digital input signals, respectively, to correspond to the first state.

2. The digital input circuit of claim 1, wherein the first and second subcircuits have a single cross connection to each other.

3. The digital input circuit of claim 1, wherein the first subcircuit comprises a first electronic switching element by which the combined test and current increasing apparatus is connected to the first subcircuit.

4. The digital input circuit of claim 3, wherein the second subcircuit comprises a second electronic switching element by which the combined test and current increasing apparatus is connected to the second subcircuit.

5. The digital input circuit of claim 4, wherein the first and second electronic switching elements respectively comprise first and second switching transistors.

6. The digital input circuit of claim 5, wherein the first and second switching transistors are connected in parallel to each other.

7. The digital input circuit of claim 1, wherein the combined test and current increasing apparatus comprises a clock reference apparatus to modulate the driving signal of the combined test and current increasing apparatus.

8. A safety switching apparatus for switching on and fail-safe switching off a technical system, the safety switching apparatus comprising:
   the digital input circuit of claim 1; and
   the least one signal generator.

9. A digital input circuit for receiving digital input signals of at least one signal generator, the digital input circuit comprising:
   a first subcircuit including: a first digital input to receive a first digital input signal; and a first threshold value element to determine a logic state of the first subcircuit, wherein the first subcircuit adopts a first state in response to the first digital input signal reaching or falling below a first lower threshold value and adopts a second state in response to the first digital input signal reaching or exceeding a first upper threshold value;
   a second subcircuit including: a second digital input to receive a second digital input signal; and a second threshold value element to determine a logic state of the second subcircuit, wherein the second subcircuit adopts the first state in response to the second digital input signal reaching or falling below a second lower threshold value and adopts the second state in response to the second digital input signal reaching or exceeding a second upper threshold value; and
   a combined test and current increasing apparatus to generate a driving signal such that a function test of both the first and second subcircuits is conducted simultaneously with the driving signal, and an input current of the first and second digital inputs is increased, wherein the first subcircuit comprises a first electronic switching element by which the combined test and current increasing apparatus is connected to the first subcircuit.

10. The digital input circuit of claim 9, wherein the second subcircuit comprises a second electronic switching element by which the combined test and current increasing apparatus is connected to the second subcircuit.

11. The digital input circuit of claim 10, wherein the first and second electronic switching elements respectively comprise first and second switching transistors.

12. The digital input circuit of claim 11, wherein the first and second switching transistors are connected in parallel to each other.

13. The digital input circuit of claim 9, wherein the combined test and current increasing apparatus comprises a clock reference apparatus to modulate the driving signal of the combined test and current increasing apparatus.

14. A safety switching apparatus for switching on and fail-safe switching off a technical system, the safety switching apparatus comprising:
   the digital input circuit of claim 9; and
   the least one signal generator.

* * * * *